United States Patent
Shi

(10) Patent No.: US 10,553,169 B2
(45) Date of Patent: Feb. 4, 2020

(54) GATE DRIVING CIRCUIT AND LIQUID CRYSTAL DISPLAY DEVICE

(71) Applicant: Shenzhen China Star Optoelectronics Technology Co., Ltd., Shenzhen (CN)

(72) Inventor: Longqiang Shi, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 196 days.

(21) Appl. No.: 15/327,319

(22) PCT Filed: Dec. 20, 2016

(86) PCT No.: PCT/CN2016/110944
§ 371 (c)(1),
(2) Date: Aug. 16, 2017

(87) PCT Pub. No.: WO2018/040390
PCT Pub. Date: Mar. 8, 2018

(65) Prior Publication Data
US 2019/0180707 A1    Jun. 13, 2019

(30) Foreign Application Priority Data
Aug. 31, 2016 (CN) .......................... 2016 1 0794205

(51) Int. Cl.
*G09G 3/36* (2006.01)
*G09G 3/3266* (2016.01)

(52) U.S. Cl.
CPC ......... *G09G 3/3677* (2013.01); *G09G 3/3648* (2013.01); *G09G 3/3266* (2013.01);
(Continued)

(58) Field of Classification Search
CPC .. G09G 3/3266; G09G 3/3674; G09G 3/3677; G09G 3/3648; G09G 2320/045; G09G 2310/0267; G09G 2310/0286
See application file for complete search history.

(56) References Cited

U.S. PATENT DOCUMENTS 9,576,677 B2 * 2/2017 Dai ...................... G09G 3/3677
9,858,880 B2 * 1/2018 Dai ...................... G09G 3/3677
(Continued)

FOREIGN PATENT DOCUMENTS

CN         103985343 A      8/2014
CN         104464660 A      3/2015
(Continued)

OTHER PUBLICATIONS

Chinesse Office Action for related Chinese Application No. 201610794205.0 action dated Feb. 13, 2018.(6 Pages).
(Continued)

*Primary Examiner* — Tom V Sheng

(57) ABSTRACT

Disclosed are a gate driving circuit and a liquid crystal display device. The gate driving circuit comprises multi-stages of gate driving units. A gate driving unit at each stage includes a pull-down holding module which maintains an electric potential at an output terminal of a gate driving unit at a present stage at a negative electric potential. The influence of a right drift of a threshold voltage of an eighty-second transistor on the gate driving unit can be avoided, and further a speed of pulling down an electric potential at a first node can be increased.

18 Claims, 6 Drawing Sheets

(52) U.S. Cl.
CPC .............. *G09G 2310/0267* (2013.01); *G09G 2320/045* (2013.01)

(56) References Cited

U.S. PATENT DOCUMENTS

| | | |
|---|---|---|
| 2004/0227718 A1 | 11/2004 | Park |
| 2016/0343330 A1* | 11/2016 | Dai ...................... G09G 3/3677 |
| 2016/0343331 A1* | 11/2016 | Dai ...................... G09G 3/3677 |

FOREIGN PATENT DOCUMENTS

| | | |
|---|---|---|
| CN | 104464662 A | 3/2015 |
| CN | 104464671 A | 3/2015 |
| CN | 104795034 A | 7/2015 |
| CN | 104851403 A | 8/2015 |

OTHER PUBLICATIONS

International Search Report and Written Opinion for related international Application No. PCT/CN2016/110944; report dated May 31, 2017;(3Pages).

* cited by examiner

GATE DRIVING CIRCUIT AND LIQUID CRYSTAL DISPLAY DEVICE

CROSS-REFERENCE TO RELATED APPLICATIONS

This application claims the priority of Chinese patent application CN201610794205.0, entitled "Gate driving circuit and liquid crystal display device" and filed on Aug. 31, 2016, the entirety of which is incorporated herein by reference.

FIELD OF THE INVENTION

The present disclosure relates to the technical field of display, and in particular, to a gate driving circuit and a liquid crystal display device.

BACKGROUND OF THE INVENTION

Gate Drive On Array (GOA) technology is a driving mode, in which gate drives are disposed on a thin film transistor (TFT) array substrate by means of a process for manufacturing a thin film transistor array so as to achieve driving row by row.

Since the GOA technology is beneficial for design of a narrow bezel on a gate drive side of a display screen and a reduction of cost, it is widely applied and researched.

With the development of oxide semiconductor thin film transistors (for example, indium gallium zinc oxide (IGZO) thin film transistors), integrated circuits which are on the periphery of a panel with an oxide semiconductor become a focus of attention. Since carrier mobility of oxide thin film transistors is 20 to 30 times of carrier mobility of amorphous silicon thin film transistors, charge and discharge rates of the thin film transistor to pixel electrodes can be greatly increased. As can be seen, the oxide thin film transistor can increase a response speed of pixels and achieve a faster refresh rate, so that the row scan rate of the pixels can be greatly increased and an ultra high resolution in a TFT-LCD becomes possible. A GOA circuit of the oxide semiconductor thin film transistors may replace a GOA circuit of the amorphous silicon thin film transistors in the future.

However, there is little development on the GOA circuit of the oxide semiconductor thin film transistors in the prior art, because many problems caused by electrical properties per se of the oxide thin film transistors need to be overcome. Specifically, since IGZO is an N-type semiconductor and does not have many holes, an IGZO-TFT generally exhibits a better negative bias temperature stress (NBTS) property. However, a positive bias temperature stress (PBTS) of the IGZO-TFT is unsatisfactory. A long-time positive bias temperature stress will cause a positive drift of a voltage threshold (Vth) of the TFT, so that a speed for turning on an IGZO-TFT device becomes slow, which further has a serious influence on the GOA circuit.

SUMMARY OF THE INVENTION

The technical problem to be solved by the present disclosure is that a positive bias temperature stress of an IGZO-TFT is unsatisfactory in the prior art. A long-time positive bias temperature stress will cause a positive drift of a voltage threshold (Vth) of a TFT so that a speed for turning on an IGZO-TFT device becomes slow, which further has a serious influence on the GOA circuit.

To solve the above technical problem, the present disclosure provides a gate driving circuit and a liquid crystal display device.

According to one aspect of the present disclosure, a gate driving circuit is provided. The gate driving circuit comprises multi-stages of gate driving units connected in series. A gate driving unit at each stage is configured to output a scan signal at an output terminal thereof according to a scan signal output by a gate driving unit at a previous stage, a scan signal output by a gate driving unit at a next stage, and a clock signal. The gate driving unit at each stage includes a pull-down holding module for maintaining an electric potential at an output terminal of a gate driving unit at a present stage at a negative electric potential. The pull-down holding module has a fifty-first transistor. A gate and a drain of the fifty-first transistor are both connected to a constant-voltage high electric potential output terminal, and a source thereof is connected to a fourth node. The pull-down holding module further has a fifty-second transistor. A gate of the fifty-second transistor is connected to a first node, a drain thereof is connected to the fourth node, and a source thereof is connected to a first negative electric potential output terminal. The pull-down holding module further has a fifty-third transistor. A gate of the fifty-third transistor is connected to the fourth node, a drain thereof is connected to the constant-voltage high electric potential output terminal, and a source thereof is connected to a second node. The pull-down holding module further has a fifty-fourth transistor. A gate of the fifty-fourth transistor is connected to the first node, a drain thereof is connected to the second node, and a source thereof is connected to a third node. The pull-down holding module further has a seventy-third transistor, a gate of the seventy-third transistor is connected to the second node, a drain thereof is connected to the constant-voltage high electric potential output terminal, and a source thereof is connected to the third node. The pull-down holding module further has a seventy-fourth transistor. A gate of the seventy-fourth transistor is connected to the first node, a drain thereof is connected to the third node, and a source thereof is connected to a constant-voltage low electric potential output terminal. The pull-down holding module further has a forty-second transistor. A gate of the forty-second transistor is connected to the second node, a drain thereof is connected to the first node, and a source thereof is connected to the constant-voltage low electric potential output terminal. The pull-down holding module further has a thirty-second transistor. A gate of the thirty-second transistor is connected to the second node, a drain thereof is connected to the output terminal of the gate driving unit at the present stage, and a source thereof is connected to the first negative electric potential output terminal. The electric potential at the constant-voltage low electric potential output terminal is lower than the electric potential at the first negative electric potential output terminal.

Preferably, the pull-down holding module further has a first transistor. A gate of the first transistor is connected to the constant-voltage high electric potential output terminal, a drain thereof is connected to the first node, and a source thereof is connected to the drain of the forty-second transistor. The pull-down holding module further has a second transistor. A gate of the second transistor is connected to the second node, a drain thereof is connected to the first node, and a source thereof is connected to the drain of the forty-second transistor.

Preferably, the gate driving unit further includes an input control module, which is configured to be controlled by a scan signal output by the gate driving unit at the previous stage so as to control an electric potential at the first node.

Preferably, the gate driving unit further includes an output control module, which is connected to the first node and is configured to control the electric potential at the output terminal of the gate driving unit at the present stage according to the electric potential at the first node.

Preferably, the gate driving unit further includes a pull-down module, which is configured to pull down the electric potential at the output terminal of the gate driving unit at the present stage.

Preferably, an electric potential at the constant-voltage high electric potential output terminal is in a range of from 20 V to 30 V.

Preferably, the electric potential at the constant-voltage low electric potential output terminal and the electric potential at the first negative electric potential output terminal are both in a range from −5 V to −8 V.

Preferably, the input control module has an eleventh transistor. A drain of the eleventh transistor is connected to the constant-voltage high electric potential output terminal, a gate thereof is connected to a drive output terminal of the gate driving unit at the previous stage, and a source thereof is connected to the first node.

Preferably, the output control module has a twenty-first transistor. A gate of the twenty-first transistor is connected to the first node, a drain thereof is connected to an output terminal of the clock signal, and a source thereof is connected to the output terminal of the gate driving unit at the present stage. The output control module further has a twenty-second transistor. A gate of the twenty-second transistor is connected to the first node, a drain thereof is connected to the output terminal of the clock signal, and a source thereof is connected to the drive output terminal of the gate driving unit at the present stage. The output control module further has a bootstrap capacitor, through which the first node is connected to the output terminal of the gate driving unit at the present stage.

Preferably, the pull-down module has a fortieth transistor and a forty-first transistor. A gate and a drain of the fortieth transistor are both connected to the first node, and a source thereof is connected to a drain of the forty-first transistor. A gate of the forty-first transistor is connected to the output terminal of the gate driving unit at the next stage, and a source thereof is connected to the output terminal of the gate driving unit at the present stage.

According to another aspect of the present disclosure, a liquid crystal display device is further provided. The liquid crystal display device comprises the above-mentioned gate driving circuit.

Compared with the prior art, one or more embodiments of the above solution can have the following advantages or achieve the following beneficial effects.

The present disclosure can avoid the influence of a right drift of a threshold voltage of the transistor on the gate driving circuit. Moreover, the present disclosure ensures a normal switching of the transistor by modifying a control signal terminal so as to guarantee a normal driving signal output from the gate driving circuit. Therefore, the present disclosure improves stability of the gate driving circuit to a great extent, and it is beneficial for an improvement of display effects of a liquid crystal display panel.

Other features and advantages of the present disclosure will be further explained in the following description, and will partly become self-evident therefrom, or be understood through the implementation of the present disclosure. The objectives and advantages of the present disclosure will be achieved through the structures specifically pointed out in the description, claims, and the accompanying drawings.

BRIEF DESCRIPTION OF THE DRAWINGS

The accompanying drawings are provided for better understanding the present disclosure, and constitute one part of the description. The accompanying drawings are used for explaining the present disclosure together with the embodiment of the present disclosure, rather than restricting the present disclosure. In the accompanying drawings.

DETAILED DESCRIPTION OF THE EMBODIMENTS

The present disclosure will be explained in detail below with reference to the embodiments and the accompanying drawings, so that one can fully understand how the present disclosure solves the technical problem and achieves the technical effects through technical means, thereby implementing the same. It should be noted that as long as there is no structural conflict, any of the embodiments and any of the technical features thereof may be combined with one another, and the technical solutions obtained therefrom all fall within the scope of the present disclosure.

A positive bias temperature stress of an IGZO-TFT is unsatisfactory in the prior art. A long-time positive bias temperature stress will cause a positive drift of a voltage threshold (Vth) of a TFT so that a speed for turning on an IGZO-TFT device becomes slow, which further has a serious influence on a GOA circuit.

Figure 1:
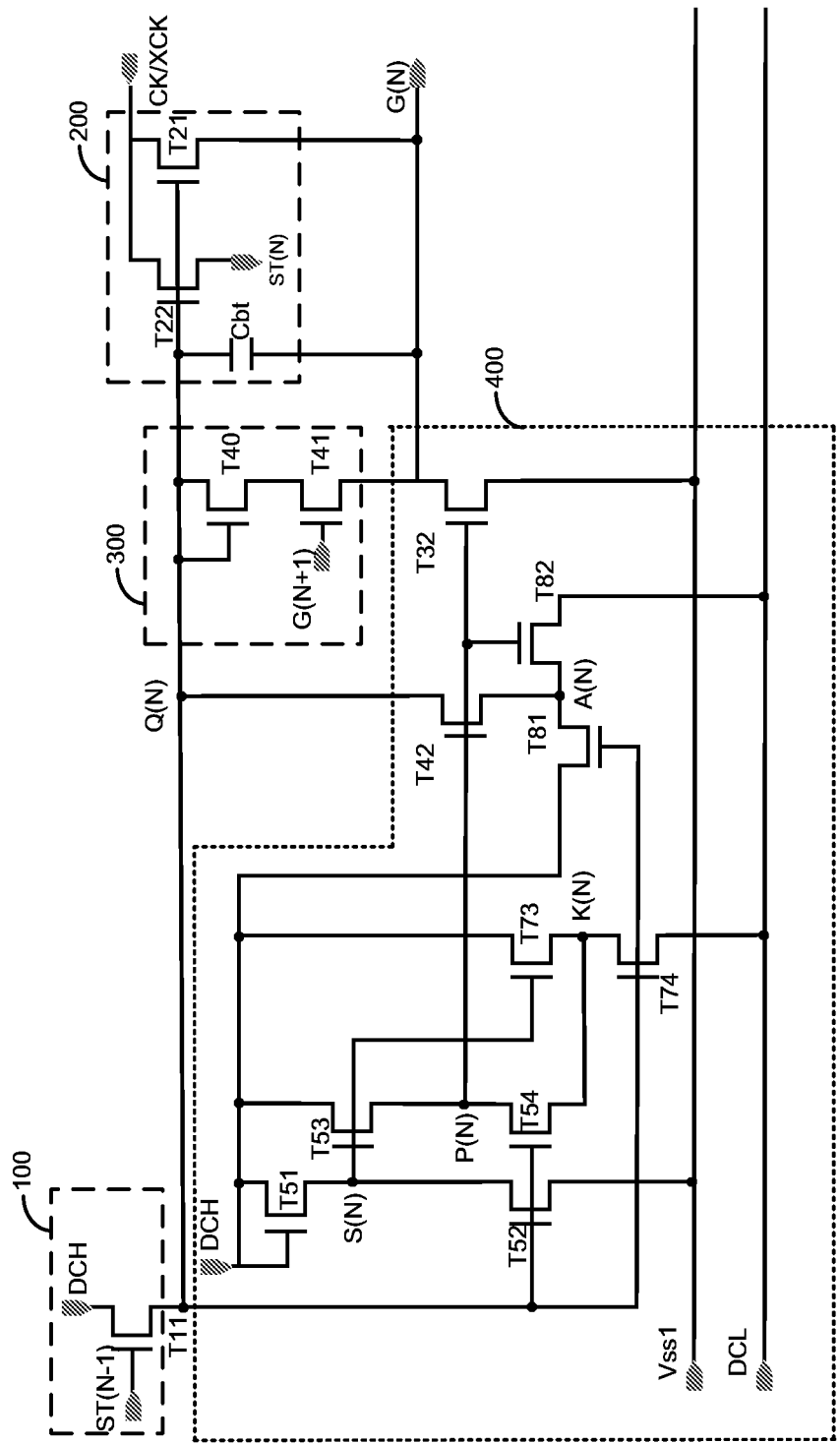
FIG. 1 schematically shows a circuit of a gate driving unit in the prior art.

In the prior art, a gate driving circuit comprises multi-stages of gate driving units. FIG. 1 schematically shows a circuit of a gate driving unit in the prior art. Referring to FIG. 1, the gate driving unit at each stage includes an input control module 100, an output control module 200, a pull-down module 300, and a pull-down holding module 400.

The input control module 100 is controlled by a drive output terminal ST(N−1) of a gate driving unit at a previous stage so as to control an electric potential at a first node Q(N). The output control module 200 is connected to the first node Q(N). The output control module 200 controls an electric potential at an output terminal G(N) of a gate driving unit at a present stage according to the electric potential at the first node Q(N). The pull-down module 300 is connected to the output control module 200. The pull-down module 300 pulls down the electric potential at the output terminal G(N) of the gate driving unit at the present stage according to an electric potential at a second node P(N). The pull-down holding module 400 is connected to the pull-down module 300. The pull-down holding module 400 maintains the electric potential at the second node P(N) during a non-scanning period so as to maintain the electric potential at the output terminal G(N) of the gate driving unit at the present stage at a negative electric potential.

Referring to FIG. 1, the pull-down holding module 400 has a fifty-first transistor T51, a fifty-second transistor T52, a fifty-third transistor T53, a fifty-fourth transistor T51, a seventy-third transistor T73, a seventy-fourth transistor T74, a eighty-first transistor T81, a eighty-second transistor T82, a forty-second transistor T42, and a thirty-second transistor T32.

For the fifty-first transistor T51, a gate and a drain thereof are both connected to a constant-voltage high electric potential output terminal DCH, and a source thereof is connected to a fourth node S(N). For the fifty-second transistor T52, a gate thereof is connected to the first node Q(N), a drain thereof is connected to the fourth node S(N), and a source thereof is connected to a first negative electric potential output terminal VSS1. For the fifty-third transistor T53, a gate thereof is connected to the fourth node S(N), a drain thereof is connected to the constant-voltage high electric potential output terminal DCH, and a source thereof is connected to the second node P(N). For the fifty-fourth transistor T54, a gate thereof is connected to the first node Q(N), a drain thereof is connected to the second node P(N), and a source thereof is connected to a third node K(N). For the seventy-third transistor T73, a gate thereof is connected to the fourth node S(N), a drain thereof is connected to the constant-voltage high electric potential output terminal DCH, and a source thereof is connected to the third node K(N). For the seventy-fourth transistor T74, a gate thereof is connected to the first node Q(N), a drain thereof is connected to the third node K(N), and a source thereof is connected to a constant-voltage low electric potential output terminal DCL. For the eighty-first transistor T81, a gate thereof is connected to the first node Q(N), a drain thereof is connected to the constant-voltage high electric potential output terminal DCH, and a source thereof is connected to a fifth node A(N). For the eighty-second transistor T82, a gate thereof is connected to the second node P(N), and a drain thereof is connected to the constant-voltage low electric potential output terminal DCL, and a source thereof is connected to the fifth node A(N). For the forty-second transistor T42, a gate thereof is connected to the second node P(N), a drain thereof is connected to the first node Q(N), and a source thereof is connected to the fifth node A(N). For the thirty-second transistor T32, a gate thereof is connected to the second node P(N), a drain thereof is connected to the output terminal G(N) of the gate driving unit at the present stage, and a source thereof is connected to the first negative electric potential output terminal VSS1.

Figure 2:
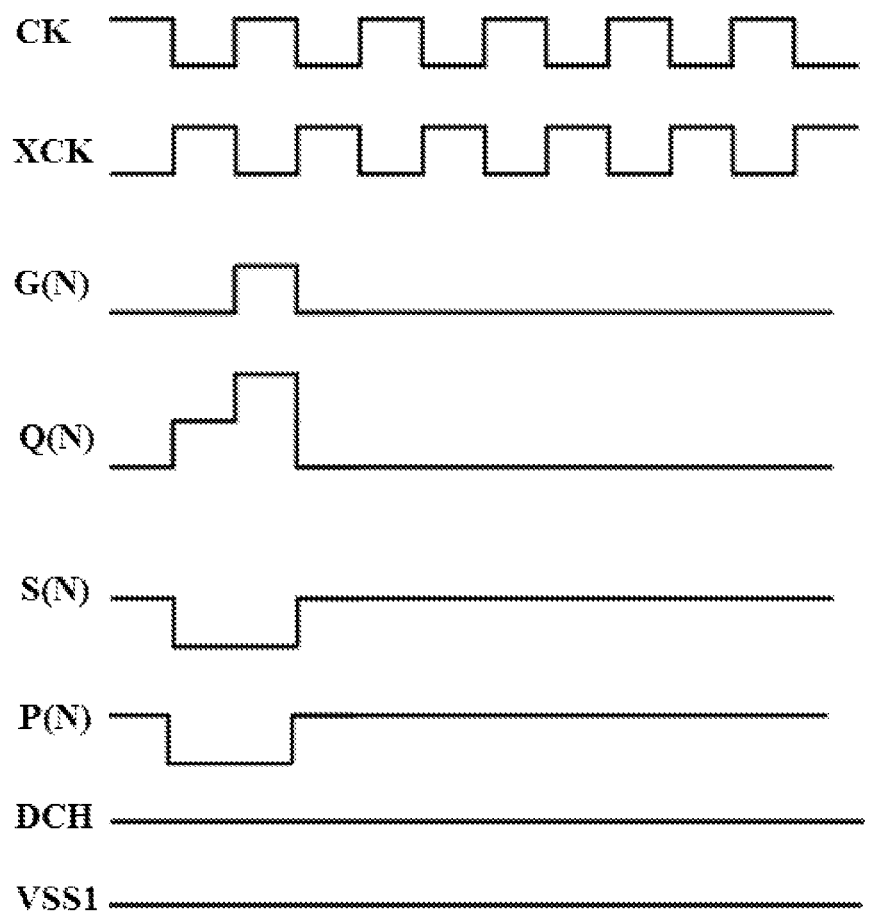
FIG. 2 schematically shows a waveform arrangement of the gate driving unit and output waveforms of key nodes under a normal condition in the prior art.
Figure 3:
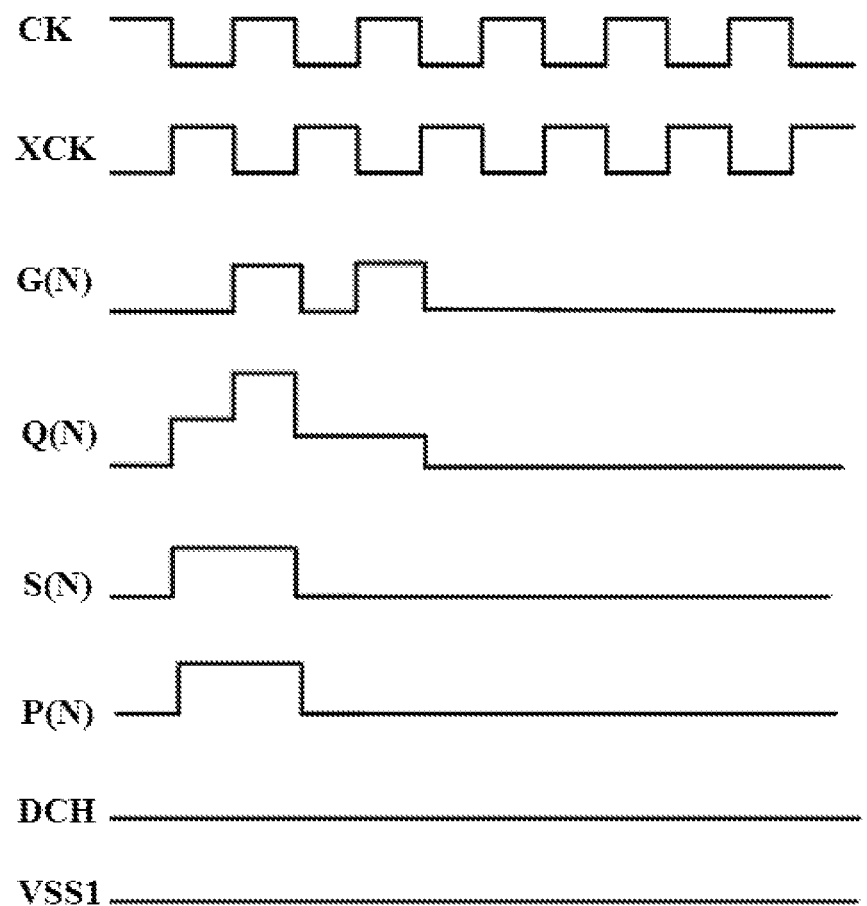
FIG. 3 schematically shows the waveform arrangement of the gate driving unit and output waveforms of key nodes under an abnormal condition of a right drift of a threshold voltage of a thin film transistor in the prior art.

Defects of the gate driving unit in the prior art are illustrated below in combination with the accompanying drawings FIGS. 1 to 3. FIG. 2 schematically shows a waveform arrangement of the gate driving unit and output waveforms of key nodes under a normal condition in the prior art. FIG. 3 schematically shows the waveform arrangement of the gate driving unit and output waveforms of key nodes under an abnormal condition of a right drift of a threshold voltage of a thin film transistor in the prior art.

During each frame of scanning, the eighty-second transistor T82 in the pull-down holding module 400 is in an on-state most of the time. A positive bias temperature stress is thus applied for a long time to the eighty-second transistor T82, which causes a positive drift of a voltage threshold of the eighty-second transistor T82. Thus, the eighty-second transistor T82 cannot be turned off as fast as under a normal condition so that a speed of pulling down the electric potential at the first node Q(N) is influenced. Referring to FIGS. 2 and 3, since the electric potential at the first node Q(N) is pulled down very slowly, the twenty-first transistor 21 is kept in an on-state for a period of time. Thus, time signals CK are continuously input into the output terminal G(N) of the gate driving unit at the present stage, and further an abnormality of charge as illustrated in FIG. 3 is caused.

Besides, in the traditional pull-down holding module 400 as illustrated in FIG. 1, the gate of the seventy-third transistor T73 is connected to the fourth node S(N). An electric potential at the fourth node S(N) is obtained by voltage division by means of two equivalent resistances, i.e., an equivalent resistance of the fifty-first transistor T51 and an equivalent resistance of the fifty-second transistor T52. During each frame of scanning, the fifty-second transistor T52 is in the on-state most of the time. A positive bias temperature stress is thus applied for a long time to the fifty-second transistor T52, which causes a positive drift of a voltage threshold of the fifty-second transistor T52. In this way, the equivalent resistance of the fifty-second transistor T52 increases, and a main inverter fails to function. Further, the electric potential at the fourth node S(N) is unstable. When the electric potential at the first node Q(N) is high, the electric potential at the fourth node S(N) is high. Thus, when the seventy-third transistor T73 is turned on, the electric potential at the second node P(N) is also high. Finally, the forty-second transistor T42 and the eighty-second T82 are turned on, and further the electric potential at the first node Q(N) is pulled down. The waveform under the abnormal condition as illustrated in FIG. 3 is thus obtained.

In order to solve the above-mentioned technical problem, a gate driving circuit is provided in an embodiment of the present disclosure. The gate driving circuit in the present embodiment comprises multi-stages of gate driving units connected in series. A gate driving unit at each stage is configured to output a scan signal at an output terminal thereof according to a scan signal output by a gate driving unit at a previous stage, a scan signal output by a gate driving unit at a next stage, and a clock signal. Circuit structures of respective stages of gate driving units included in the gate driving circuit are the same.

Figure 4:
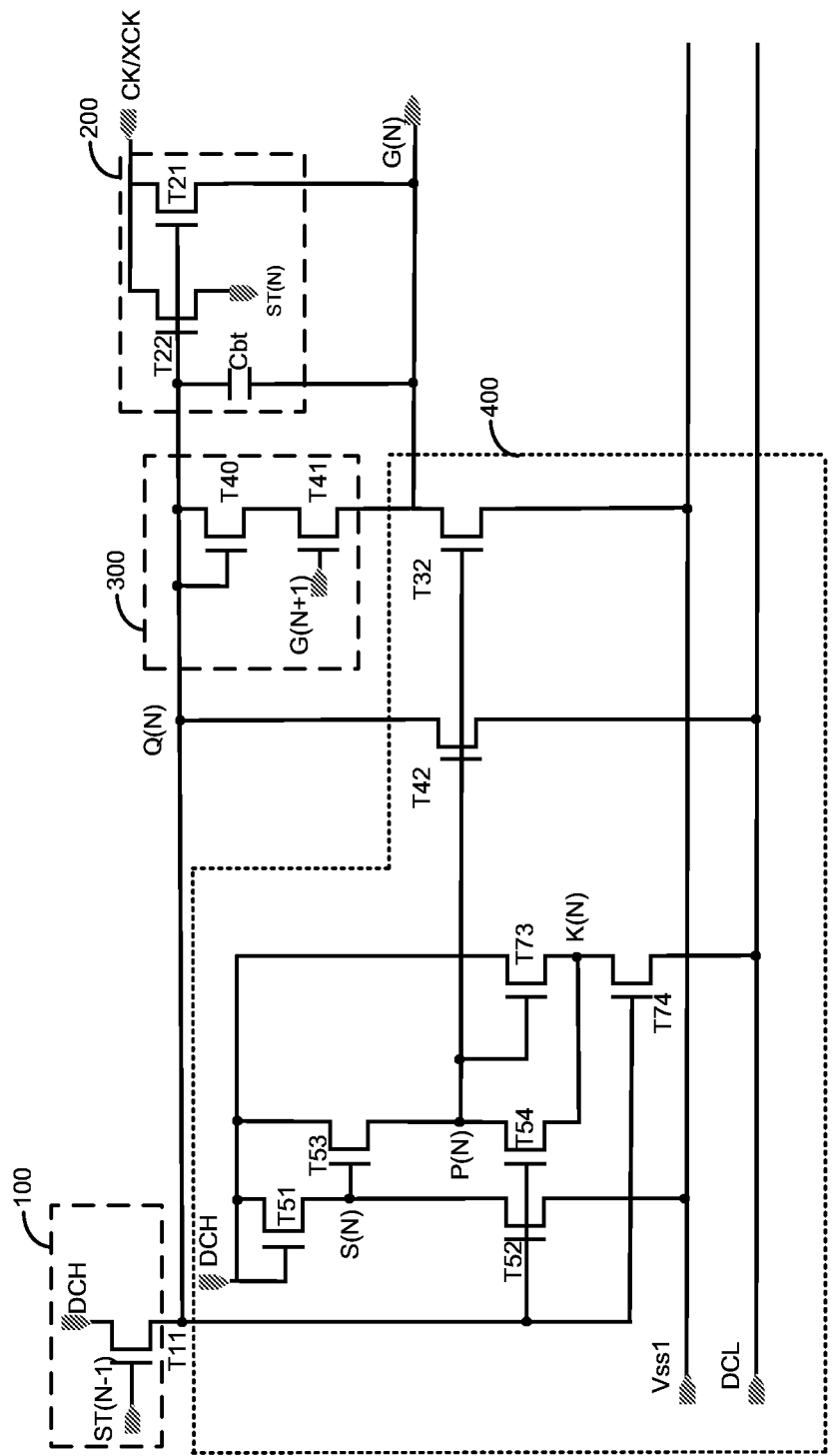
FIG. 4 schematically shows a circuit of a gate driving unit in an embodiment of the present disclosure.

FIG. 4 schematically shows a circuit structure of a gate driving unit in the present embodiment. Referring to FIG. 4, the gate driving unit in the embodiment of the present disclosure mainly comprises an input control module 100, an output control module 200, a pull-down module 300, and a pull-down holding module 400.

The circuit structures and operating principles of respective modules are described in detail below.

The input control module 100 includes an eleventh transistor T11. A drain of the eleventh transistor T11 is connected to a constant-voltage high electric potential output terminal DCH, a gate thereof is connected to a drive output terminal ST(N−1) of the gate driving unit at the previous stage, and a source thereof is connected to a first node Q(N).

The output control module 200 includes a twenty-first transistor T21, a twenty-second transistor T22, and a bootstrap capacitor Cbt. A gate of the twenty-first transistor T21 is connected to a first node Q(N), a drain of thereof is connected to an output terminal CK/XCK of the clock signal and a source thereof is connected to an output terminal G(N) of the gate driving unit at a present stage. A gate of the twenty-second transistor T22 is connected to the first node Q(N), a drain thereof is connected to the output terminal CK/XCK of the clock signal and a source thereof is connected to a drive output terminal ST(N) of the gate driving unit at the present stage. The first node Q(N) is connected to the output terminal G(N) of the gate driving unit at the present stage through the bootstrap capacitor Cbt.

The pull-down module 300 includes a fortieth transistor T40 and a forty-first transistor T41. A gate and a drain of the fortieth transistor T40 are both connected to the first node Q(N), and a source thereof is connected to a drain of the forty-first transistor T41. A gate of the forty-first transistor T41 is connected to an output terminal G(N+1) of the gate driving unit at the next stage, and a source thereof is connected to the output terminal G(N) of the gate driving unit at the present stage.

The circuit structure and operating principle of the pull-down holding module 400 are described in detail below.

The pull-down holding module 400 has a fifty-first transistor T51, a fifty-second transistor T52, a fifty-third transistor T53, a fifty-fourth transistor T54, a seventy-third transistor T73, a seventy-fourth transistor T74, a forty-second transistor T42, and a thirty-second transistor T32.

For the fifty-first transistor T51, a gate and a drain thereof are both connected to a constant-voltage high electric potential output terminal DCH, and a source thereof is connected to a fourth node S(N). For the fifty-second transistor T52, a gate thereof is connected to the first node Q(N), and a drain thereof is connected to the fourth node S(N), and a source thereof is connected to a first negative electric potential output terminal VSS1. For the fifty-third transistor T53, a gate thereof is connected to the fourth node S(N), a drain thereof is connected to the constant-voltage high electric potential output terminal DCH, and a source thereof is connected to a second node P(N). For the fifty-fourth transistor T54, a gate thereof is connected to the first node Q(N), a drain thereof is connected to the second node P(N), and a source thereof is connected to a third node K(N). For the seventy-third transistor T73, a gate thereof is connected to the second node P(N), a drain thereof is connected to the constant-voltage high electric potential output terminal DCH, and a source thereof is connected to the third node K(N). For the seventy-fourth transistor T74, a gate thereof is connected to the first node Q(N), a drain thereof is connected to the third node K(N), and a source thereof is connected to a constant-voltage low electric potential output terminal DCL. For the forty-second transistor T42, a gate thereof is connected to the second node P(N), a drain thereof is connected to the first node Q(N), and a source thereof is connected to the constant-voltage low electric potential output terminal. For the thirty-second transistor T32, a gate thereof is connected to the second node P(N), a drain thereof is connected to the output terminal G(N) of the gate driving unit at the present stage, and a source thereof is connected to the first negative electric potential output terminal VSS1.

An electric potential at the constant-voltage low electric potential output terminal DCL is lower than an electric potential at the first negative potential output terminal VSS1. In a preferable embodiment of the present disclosure, an electric potential at the constant-voltage high electric potential output terminal DCH is in a range of from 20 V to 30 V. The electric potential at the constant-voltage low electric potential output terminal DCL and the electric potential at the first negative electric potential output terminal VSS1 are both in a range of from −5 V to −8 V. CK and XCK shown in the figures are clock signals having opposite phases to each other.

A special dual inverter design is used for the pull-down holding module 400. The fifty-first transistor T51, the fifty-second transistor T52, the fifty-third transistor T53, and the fifty-fourth transistor T54 constitute a main inverter. The seventy-third transistor T73 and the seventy-fourth transistor T74 constitute an auxiliary inverter. The main inverter functions to control two transistors, i.e., the thirty-second transistor T32 and the forty-second transistor T42. The auxiliary inverter functions to provide a low electric potential to the main inverter during an operating period and provide a proper high electric potential to the main inverter during a non-operating period to decrease leakage current in the fifty-fourth transistor T54 so as to ensure that the main inverter can generate a higher electric potential during the non-operating period. The auxiliary inverter uses the second node P(N) in the main inverter to control the seventy-third transistor T73, by way of which the number of the elements of the auxiliary inverter is reduced. Moreover, no additional element is needed to generate a waveform similar to the waveform generated at the second node P(N) so as to control the seventy-third transistor T73. The second node P(N) is more stable than the fourth node S(N), and is beneficial for improving stability of the gate driving circuit.

During the operating period, after the auxiliary inverter is driven by a high voltage at the second node P(N) and a low voltage at the constant-voltage low electric potential output terminal DCL, an electric potential at the fifty-second transistor T52 is pulled down to the electric potential at the first negative electric potential output terminal VSS1. Further, when the electric potential at the first node Q(N) is high, the seventy-fourth transistor T74 is turned on, and an electric potential at the seventy-fourth transistor T74 is pulled down to the electric potential at the constant-voltage high electric potential output terminal DCH. Thus, an electric potential at the third node K(N) is lower, and an electric potential at the second node P(N) is pulled down to a much lower electric potential. That is, during the operating period, the auxiliary inverter provides a low electric potential to the main inverter. Thus, leakage current, caused by a physical property that threshold voltages of the thirty-second transistor T32 and the forty-second transistor T42 are very low or approach 0 V, can be avoided, which can ensure that an electric potential at the pull-down holding module 400 can be pulled down normally during the operating period.

During the non-operating period, the fifty-second transistor T52, the fifty-fourth transistor T54, and the seventy-fourth transistor T74 are all turned off. The gate of the fifty-fourth transistor T54 is connected to the first node Q(N), and the source thereof is connected to the third node K(N). Thus, an electric potential at the gate of the fifty-fourth transistor T54 is negative and an electric potential at the source thereof is positive. In this way, a voltage difference between a voltage at the gate of the fifty-fourth transistor T54 and a voltage at the source thereof is a negative electric potential. Thus, the fifty-fourth transistor T54 can be turned off well, and leakage current therein can be reduced. In other words, the auxiliary inverter provides a proper high electric potential to the main inverter during the non-operating period so as to reduce the leakage current in the fifty-fourth transistor T54, which ensures that the electric potential at the pull-down holding module 400 is higher during the non-operating period and effectively maintains a lower electric potential at the first node Q(N) and the output terminal G(N). Besides, when the electric potential at the third node K(N) is high, the third node K(N) also functions as a voltage dividing resistor, which can push the electric potential at the second node P(N) to be higher. Thus, the electric potential at the second node P(N) can be more stable. Using the second node P(N), the electric potential at which is more stable, to control a switching of the seventy-third transistor T73 further helps to increase the stability of the gate driving circuit.

In order to avoid the technical problems existing in the prior art, the present embodiment is provided to fundamentally solve the abnormal operation of the gate driving circuit, caused by a right drift of the threshold voltage at the eighty-second transistor T82 and the seventy-third transistor T73 in the gate driving circuit.

On the one hand, the present embodiment does not include an eighty-first transistor T81 and an eighty-second transistor T82 as described in the prior art. In this way, the forty-second transistor T42 can be directly connected to the constant-voltage low electric potential output terminal DCL. Such a circuit structure can avoid the influence of a right drift of a threshold voltage of the eighty-second transistor T82 on the gate driving circuit. Besides, such a circuit structure can increase a speed of pulling down the electric potential at the first node Q(N).

Figure 5:
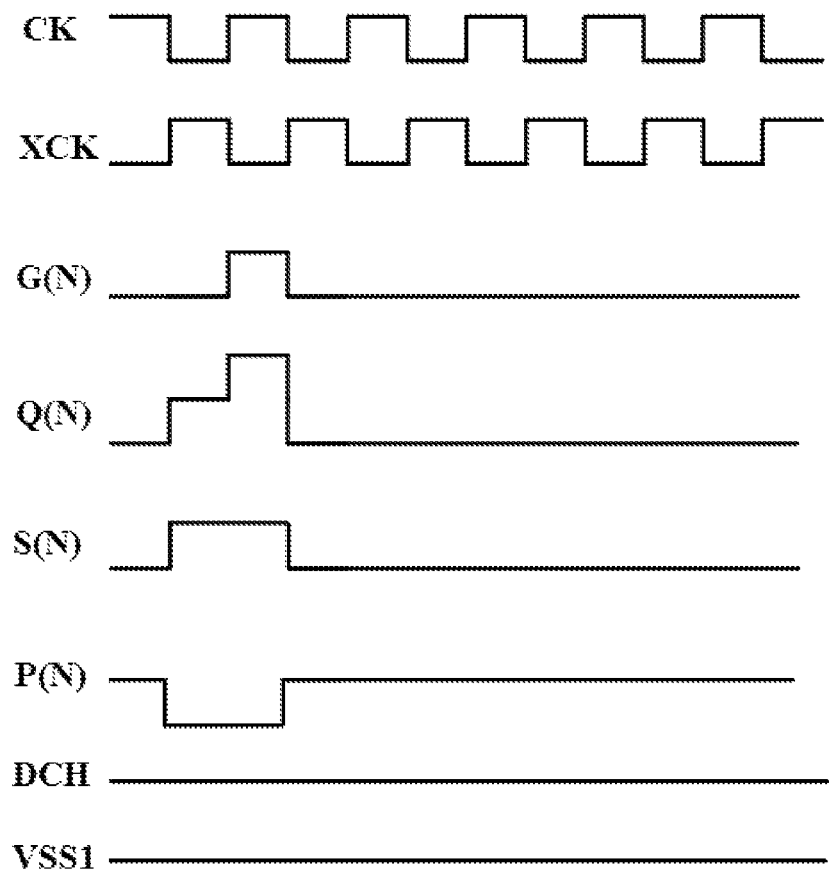
FIG. 5 schematically shows a waveform arrangement of the gate driving unit and output waveforms of key nodes in the embodiment of the present disclosure.

On the other hand, in the present embodiment, the gate of the seventy-third transistor T73 is connected to the second node P(N), the electric potential at which is stable. Since a stable electric potential at the second node P(N) is beneficial for the inverter to function well, the circuit structure ensures a normal switching of the seventy-third transistor T73 (as shown in FIG. 5), which is in favor of the stability of the gate driving circuit.

To sum up, the technical solutions of the present embodiment help to improve the stability of the gate driving circuit to a great extent, which is beneficial for an improvement of display effects of a liquid crystal display panel.

Figure 6:
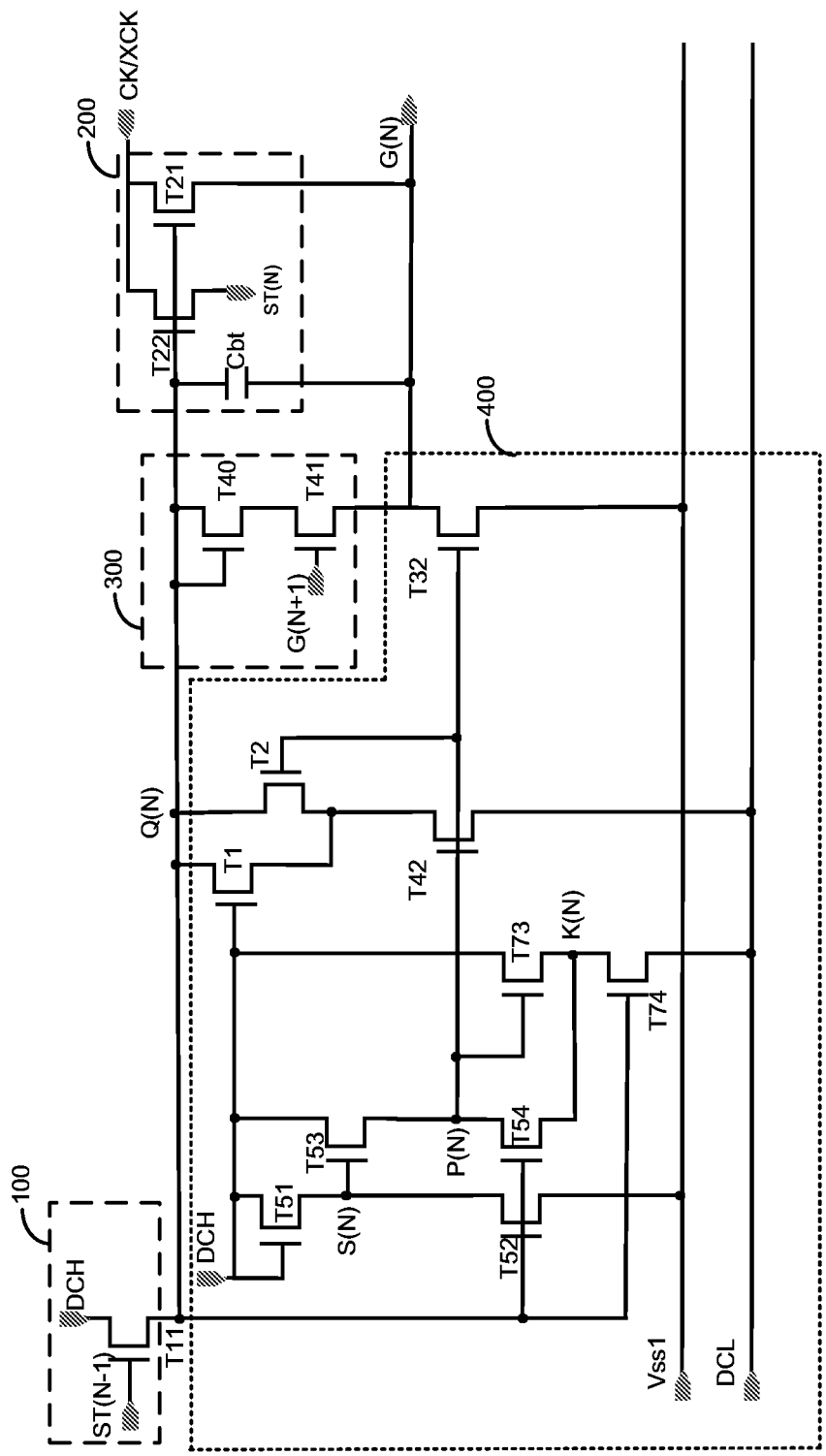
FIG. 6 schematically shows another circuit of the gate driving unit in the embodiment of the present disclosure.

FIG. 6 schematically shows another circuit of the gate driving unit in the present embodiment. Referring to FIG. 6, the pull-down holding module 400 of the gate driving circuit in the present embodiment further has a first transistor T1 and a second transistor T2.

Specifically, a gate of the first transistor T1 is connected to the constant-voltage high electric potential output terminal DCH, a drain thereof is connected to the first node Q(N), and a source thereof is connected to the drain of the forty-second transistor T42. A gate of the second transistor T2 is connected to the second node P(N), a drain thereof is connected to the first node Q(N), and a source thereof is connected to the drain of the forty-second transistor T42.

The technical solution of the present embodiment can ensure normal working of the forty-second transistor. Specifically, when the output terminal G(N) of the gate driving unit at the present stage works, the electric potential at the first node Q(N) is high, and meanwhile the electric potential at the fourth node S(N) is low. At this time, the forty-second transistor T42 and the second transistor T2 are turned off. Because the first transistor T1 is turned on, the first transistor T1 and the forty-second transistor T42 are equivalent to resistors connected in series. Thus, even if the drain of the forty-second transistor T42 is turned on, it is still difficult for a current to pass through the first transistor T1. For this reason, the electric potential at the first node Q(N) can still be pulled down, and further a normal charge of the gate driving circuit at the present stage can be ensured.

When the output terminal G(N) of the gate driving circuit at the present stage does not work, the electric potential at the first node Q(N) is low, and meanwhile the electric potential at the fourth node S(N) is high. At this time, the forty-second transistor T42, the first transistor T1, and the second transistor T42 are all turned on. The first transistor T1 and the second transistor T2 are thus equivalent to two resistors connected in parallel. Compared with a connection in series, the equivalent resistances of the first transistor T1 and the second transistor T2 connected in parallel are smaller. In this way, for the first transistor T1 and the second transistor T2, even if one of the two transistors fails to function, the other transistor can still work normally. Thus, the electric potential at the first node Q(N) can still be pulled down, and further a normal charge of the gate driving circuit at the present stage can be ensured.

The present disclosure further provides a liquid crystal display device. The liquid crystal display device comprises the abovementioned gate driving circuit. In particular, the liquid crystal display device can be either an ordinary liquid crystal display device or an organic light-emitting diode (OLED) display device.

Although the embodiment of the present disclosure is provided as above, the above embodiment is described only for better understanding, rather than restricting the present disclosure. Anyone skilled in the art can make amendments to the implementing forms or details without departing from the spirit and scope of the present disclosure. The scope of the present disclosure should be subject to the scope defined in the claims.

The invention claimed is:

1. A gate driving circuit, which comprises multi-stages of gate driving units connected in series, wherein:
   a gate driving unit at each stage is configured to output a scan signal at an output terminal thereof according to a scan signal output by a gate driving unit at a previous stage, a scan signal output by a gate driving unit at a next stage, and a clock signal; and
   the gate driving unit at each stage includes a pull-down holding module for maintaining an electric potential at an output terminal of a gate driving unit at a present stage at a negative electric potential;
   wherein the pull-down holding module has:
   a fifty-first transistor, a gate and a drain thereof being both connected to a constant-voltage high electric potential output terminal and a source thereof being connected to a fourth node;
   a fifty-second transistor, a gate thereof being connected to a first node, a drain thereof being connected to the fourth node, and a source thereof being connected to a first negative electric potential output terminal;
   a fifty-third transistor, a gate thereof being connected to the fourth node, a drain thereof being connected to the constant-voltage high electric potential output terminal, and a source thereof being connected to a second node;
   a fifty-fourth transistor, a gate thereof being connected to the first node, a drain thereof being connected to the second node, and a source thereof being connected to a third node;
   a seventy-third transistor, a gate thereof being connected to the second node, a drain thereof being connected to the constant-voltage high electric potential output terminal, and a source thereof being connected to the third node;
   a seventy-fourth transistor, a gate thereof being connected to the first node, a drain thereof being connected to the third node, and a source thereof being connected to a constant-voltage low electric potential output terminal;
   a forty-second transistor, a gate thereof being connected to the second node, a drain thereof being connected to the first node, and a source thereof being connected to the constant-voltage low electric potential output terminal; and
   a thirty-second transistor, a gate thereof being connected to the second node, a drain thereof being connected to the output terminal of the gate driving unit at the present stage, and a source thereof being connected to the first negative electric potential output terminal;

wherein the electric potential at the constant-voltage low electric potential output terminal is lower than the electric potential at the first negative electric potential output terminal.

2. The gate driving circuit according to claim 1, wherein the pull-down holding module further has:
- a first transistor, a gate thereof being connected to the constant-voltage high electric potential output terminal, a drain thereof being connected to the first node, and a source thereof being connected to the drain of the forty-second transistor; and
- a second transistor, a gate thereof being connected to the second node, a drain thereof being connected to the first node, and a source thereof being connected to the drain of the forty-second transistor.

3. The gate driving circuit according to claim 1, wherein the gate driving unit further includes:
- an input control module, which is configured to be controlled by a scan signal output by the gate driving unit at the previous stage so as to control an electric potential at the first node.

4. The gate driving circuit according to claim 3, wherein the gate driving unit further includes:
- an output control module, which is connected to the first node and is configured to control the electric potential at the output terminal of the gate driving unit at the present stage according to the electric potential at the first node.

5. The gate driving circuit according to claim 4, wherein the gate driving unit further includes:
- a pull-down module, which is configured to pull down the electric potential at the first node of the gate driving unit at the present stage.

6. The gate driving circuit according to claim 5, wherein the input control module has an eleventh transistor;
wherein a drain of the eleventh transistor is connected to the constant-voltage high electric potential output terminal, a gate thereof is connected to a drive output terminal of the gate driving unit at the previous stage, and a source thereof is connected to the first node.

7. The gate driving circuit according to claim 6, wherein the output control module has:
- a twenty-first transistor, a gate thereof being connected to the first node, a drain thereof being connected to an output terminal of the clock signal, and a source thereof being connected to the output terminal of the gate driving unit at the present stage;
- a twenty-second transistor, a gate thereof being connected to the first node, a drain thereof being connected to the output terminal of the clock signal, and a source thereof being connected to the drive output terminal of the gate driving unit at the present stage; and
- a bootstrap capacitor, through which the first node is connected to the output terminal of the gate driving unit at the present stage.

8. The gate driving circuit according to claim 6, wherein the pull-down module has a fortieth transistor and a forty-first transistor,
wherein a gate and a drain of the fortieth transistor are both connected to the first node, and a source thereof is connected to a drain of the forty-first transistor; and
a gate of the forty-first transistor is connected to the output terminal of the gate driving unit at the next stage, and a source thereof is connected to the output terminal of the gate driving unit at the present stage.

9. The gate driving circuit according to claim 1, wherein an electric potential at the constant-voltage high electric potential output terminal is in a range of from 20 V to 30 V, and/or, the electric potential at the constant-voltage low electric potential output terminal and the electric potential at the first negative electric potential output terminal are both in a range of from −5 V to −8 V.

10. A liquid crystal display device, comprising a gate driving circuit which comprises multi-stages of gate driving units connected in series, wherein:
- a gate driving unit at each stage is configured to output a scan signal at an output terminal thereof according to a scan signal output by a gate driving unit at a previous stage, a scan signal output by the gate driving unit at a next stage, and a clock signal; and
- the gate driving unit at each stage includes a pull-down holding module for maintaining an electric potential at an output terminal of a gate driving unit at a present stage at a negative electric potential;

wherein the pull-down holding module has:
- a fifty-first transistor, a gate and a drain thereof being both connected to a constant-voltage high electric potential output terminal, and a source thereof being connected to a fourth node;
- a fifty-second transistor, a gate thereof being connected to a first node, a drain thereof being connected to the fourth node, and a source thereof being connected to a first negative electric potential output terminal;
- a fifty-third transistor, a gate thereof being connected to the fourth node, a drain thereof being connected to the constant-voltage high electric potential output terminal, and a source thereof being connected to a second node;
- a fifty-fourth transistor, a gate thereof being connected to the first node, a drain thereof being connected to the second node, and a source thereof being connected to a third node;
- a seventy-third transistor, a gate thereof being connected to the second node, a drain thereof being connected to the constant-voltage high electric potential output terminal, and a source thereof being connected to the third node;
- a seventy-fourth transistor, a gate thereof being connected to the first node, a drain thereof being connected to the third node, and a source thereof being connected to a constant-voltage low electric potential output terminal;
- a forty-second transistor, a gate thereof being connected to the second node, a drain thereof being connected to the first node, and a source thereof being connected to the constant-voltage low electric potential output terminal; and
- a thirty-second transistor, a gate thereof being connected to the second node, a drain thereof being connected to the output terminal of the gate driving unit at the present stage, and a source thereof being connected to the first negative electric potential output terminal;

wherein the electric potential at the constant-voltage low electric potential output terminal is lower than the electric potential at the first negative electric potential output terminal.

11. The liquid crystal display device according to claim 10, wherein the pull-down holding module further has:
- a first transistor, a gate thereof being connected to the constant-voltage high electric potential output terminal, a drain thereof being connected to the first node, and a source thereof being connected to the drain of the forty-second transistor; and a second transistor, a gate thereof being connected to the second node, a drain thereof being connected to the first node, and a source thereof being connected to the drain of the forty-second transistor.

12. The liquid crystal display device according to claim 10, wherein the gate driving unit further includes:

an input control module, which is configured to be controlled by a. scan signal output by the gate driving unit at the previous stage so as to control an electric potential at the first node.

13. The liquid crystal display device according to claim 12, wherein the gate driving unit further includes:

an output control module, which is connected to the first node and is configured to control the electric potential at the output terminal of the gate driving unit at the present stage according to the electric potential at the first node.

14. The liquid crystal display device according to claim 13, wherein the gate driving unit further includes:

a pull-down module, which is configured to pull down the electric potential at the first node of the gate driving unit at the present stage.

15. The liquid crystal display device according to claim 14, Wherein the input control module has an eleventh transistor;

wherein a drain of the eleventh transistor is connected to the constant-voltage high electric potential output terminal, a gate thereof is connected to a drive output terminal of the gate driving unit at the previous stage, and a source thereof is connected to the first node.

16. The liquid crystal display device according to claim 15, wherein the output control module has:

a twenty-first transistor, a gate thereof being connected to the first node, a drain thereof being connected to an output terminal of the clock signal, and a source thereof being connected to the output terminal of the gate driving unit at the present stage;

a twenty-second transistor, a gate thereof being connected to the first node, a drain thereof being connected to the output terminal of the clock signal, and a source thereof being connected to the drive output terminal of the gate driving unit at the present stage; and a bootstrap capacitor, through which the first node is connected to the output terminal of the gate driving unit at the present stage.

17. The liquid crystal display device according to claim 16, wherein the pull-down module has a fortieth transistor and a forty-first transistor, wherein a gate and a drain of the fortieth transistor are both connected to the first node, a source of the fortieth transistor is connected to a drain of the forty-first transistor; and a gate of the forty-first transistor is connected to the output terminal of the gate driving unit at the next stage, and a source thereof is connected to the output terminal of the gate driving unit at the present stage.

18. The liquid crystal display device according to claim 10, wherein an electric potential at the constant-voltage high electric potential output terminal is in a range of from 20 V to 30 V, and/or, the electric potential at the constant-voltage low electric potential output terminal and the electric potential at the first negative electric potential output terminal are both in a range of from −5 V to −8 V.

* * * * *